(12) United States Patent
Kwack et al.

(10) Patent No.: US 8,760,960 B2
(45) Date of Patent: Jun. 24, 2014

(54) SEMICONDUCTOR MEMORY APPARATUS AND DATA INPUT/OUTPUT METHOD THEREOF

(75) Inventors: Seung Wook Kwack, Gyeonggi-do (KR); Kae Dal Kwack, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 96 days.

(21) Appl. No.: 13/459,660

(22) Filed: Apr. 30, 2012

(65) Prior Publication Data

US 2012/0213019 A1 Aug. 23, 2012

Related U.S. Application Data

(62) Division of application No. 12/650,771, filed on Dec. 31, 2009, now abandoned.

(30) Foreign Application Priority Data

Oct. 12, 2009 (KR) .......................... 10-2009-0096881

(51) Int. Cl.
*G11C 8/00* (2006.01)

(52) U.S. Cl.
USPC .................. 365/230.06; 365/230.03; 365/193

(58) Field of Classification Search
USPC ........................................ 365/230.03, 230.06
See application file for complete search history.

(56) References Cited

U.S. PATENT DOCUMENTS

| | | |
|---|---|---|
| 5,606,528 A | 2/1997 | Ikeda |
| 5,708,623 A | 1/1998 | Choi |
| 6,101,147 A | 8/2000 | Takahashi et al. |
| 6,456,558 B1 | 9/2002 | Cho |
| 6,704,240 B2 | 3/2004 | Kang |
| 6,819,623 B2 | 11/2004 | Jung |
| 7,203,810 B2 | 4/2007 | Kim |
| 2005/0141323 A1 | 6/2005 | Shim |
| 2005/0219898 A1 | 10/2005 | Im et al. |
| 2007/0150669 A1* | 6/2007 | Ahn et al. ...................... 711/150 |

(Continued)

FOREIGN PATENT DOCUMENTS

| | | |
|---|---|---|
| JP | 09-045083 A | 2/1997 |
| JP | 09-219091 A | 8/1997 |
| KR | 100668513 B1 | 1/2007 |
| KR | 100790446 B1 | 12/2007 |

OTHER PUBLICATIONS

USPTO RR mailed Dec. 22, 2011 in connection with U.S. Appl. No. 12/650,771.

(Continued)

*Primary Examiner* — Anthan Tran

(74) *Attorney, Agent, or Firm* — Ladas & Parry LLP

(57) ABSTRACT

A semiconductor memory apparatus includes: a first bit line of to a first memory bank; a first middle input/output line configured to be electrically connected to the first bit line; a second bit line of a second memory bank; a second middle input/output line configured to be electrically connected to the second bit line; and a shared local input/output line configured to be electrically connected to the first and second middle input/output lines. A bank selection signal controls both the electrical connection between the shared local input/output line and the first middle input/output line and the electrical connection between the shared local input/output line and the second middle input/output line.

8 Claims, 6 Drawing Sheets

(56) References Cited

U.S. PATENT DOCUMENTS

| | | |
|---|---|---|
| 2008/0123461 A1 | 5/2008 | Kim et al. |
| 2009/0059692 A1* | 3/2009 | Park .............................. 365/193 |
| 2009/0123461 A1* | 5/2009 | Fitzhugh et al. ........... 424/130.1 |

OTHER PUBLICATIONS

USPTO NFOA mailed Jan. 30, 2012 in connection with U.S. Appl. No. 12/650,771.

* cited by examiner

SEMICONDUCTOR MEMORY APPARATUS AND DATA INPUT/OUTPUT METHOD THEREOF

CROSS-REFERENCES TO RELATED APPLICATION

The present application claims priority to Korean application number 10-2009-0096881, filed on Oct. 12, 2009, which is incorporated by reference in its entirety as set forth in full.

BACKGROUND OF THE INVENTION

1. Technical Field

Embodiments of the present invention relate generally to a semiconductor technology, and more particularly, to a semiconductor memory apparatus and a data input/output method thereof.

2. Related Art

To obtain high-speed operation of semiconductor memory, a plurality of stacked memory banks constituting a stacked bank structure is being employed in the semiconductor memory apparatus to improve data access time. In a semiconductor memory apparatus having the stacked bank structure, memory cell regions are partitioned into a plurality of memory blocks, and each of the partitioned memory blocks comprises a plurality of stackedmemory banks.

FIG. 1 is a block diagram schematically showing a configuration of a semiconductor memory apparatus including stacked memory banks. As shown in FIG. 1, the semiconductor memory apparatus includes first and second memory banks Bank1 and Bank2, first and second column decoders 11 and 12, and first and second input/output (I/O) drivers 21 and 22. Hereinafter, it is assumed that the first and second memory banks Bank1 and Bank2 constitute the stacked bank structure.

The first column decoder 11 and the first input/output driver perform a data read or write (hereinafter, referred to as 'read/write') operation on the first memory bank Bank1, and the second column decoder 12 and the second input/output driver 22 perform a data read/write operation on the second memory bank Bank2. More specifically, in the data read/write operation on the first memory bank Bank1, the first column decoder 11 generates, in response to column address signal 'Ya<2:7, 9> and a strobe signal 'strobe<0>, a column selection signal 'Yi_up' to enable a column selection line 'CSL_up' of the first memory bank Bank1. In the data read/write operation on the second memory bank Bank2, the second column decoder 12 generates, in response to the column address signals 'Ya<2:7, 9> and a strobe signal 'strobe<1>, a column selection signal 'Yi_dn' to enable a column selection line 'CSL_dn' of the second memory bank Bank2. As shown in FIG. 1, the global input/output line GIO and an input/output pad DQ are shared by the memory banks Bank 1 and Bank 2. In response to their respective strobe signals 'strobe<0:1>', the first and second input/output drivers 21 and 22 amplify data stored in the first memory bank Bank1 and data stored in the second memory bank Bank2 respectively, and output the amplified data to outside of the semiconductor memory apparatus via the global input/output line GIO and an input/output pad DQ. During a data write operation, the first and second input/output drivers 21 and 22 amplify data received from outside via the pad DQ and the global input/output line GIO and transfer the amplified data to the first memory bank Bank1 and to the second memory bank Bank2, respectively.

Thus, as is shown in FIG. 1 and described above, the same global input/output line GIO and the same pad DQ are assigned to each of the stacked memory banks Bank1 and Bank2 constituting the stacked bank structure. However, separate column decoders 11 and 12 and separate input/output drivers 21 and 22 are required for the stacked memory banks Bank1 and Bank2. This is because the column selection line CSL_up of the first memory bank Bank1 and the column selection line CSL_dn of the second memory bank Bank2 are different from each other and the local input/output line LIO_up of the first memory bank Bank1 and the local input/output line LIO_dn of the second memory bank Bank2 are different from each other.

The requirement of separate column decoders and input/output drivers makes it difficult to secure a lay-out margin of the semiconductor memory apparatus. A technique in which stacked memory banks share a column selection line has been proposed, but the technique causes an overload on the column decoder facing the column selection line. In addition, no proper technique that allows the stacked memory banks to share the input/output driver has been proposed until now.

SUMMARY OF THE INVENTION

Embodiments of the present invention include a semiconductor memory apparatus and a data input/output method thereof, in which a plurality of stacked memory banks can share a column decoder and an input/output driver.

In one embodiment of the present invention, a semiconductor memory apparatus includes: a first bit line of a first memory bank; a first middle input/output line configured to be electrically connected to the first bit line; a second bit line of a second memory bank; a second middle input/output line configured to be electrically connected to the second bit line; and a shared local input/output line configured to be electrically connected to the first and second middle input/output lines, wherein a bank selection signal controls both the electrical connection between the shared local input/output line and the first middle input/output line and the electrical connection between the shared local input/output line and the second middle input/output line.

In another embodiment of the present invention, a semiconductor memory apparatus includes: a shared column decoding unit configured to simultaneously enable a column selection line of the first and second memory banks in response to a column address signal and a main strobe signal; an input/output switching unit configured to selectively and electrically connect the first and second memory banks to a shared local input/output line in response to a bank selection signal; and a shared input/output driving unit configured to amplify data transferred via the shared local input/output line to transfer the amplified data onto a global input/output line in a data read operation, and amplify data transferred via the global input/output line to transfer the amplified data onto the shared local input/output line in a data write operation, in response to the main strobe signal.

In still another embodiment of the present invention, a semiconductor memory apparatus includes: a first memory bank; a second memory bank; first and second middle input/output lines configured to communicate with the first and second memory banks in response to a column selection signal, respectively; and a shared local input/output line configured to be electrically connected to the first and second middle input/output lines, wherein the column selection signal of the first and second memory banks is configured to be simultaneously enabled, and the electrical connection between the shared local input/output line and the first memory bank and the electrical connection between the shared local input/output line and the second memory bank are selectively made in response to a bank selection signal.

In still another embodiment of the present invention, a data input/output method of a semiconductor memory apparatus includes: enabling both of the column selection signals of the first and second memory banks when a data read/write operation is performed on the first memory bank and when the data read/write operation is performed on the second memory bank; and selectively and electrically connecting the first and second memory banks, on which the data read/write operation is to be actually performed, to a shared local input/output line.

BRIEF DESCRIPTION OF THE DRAWINGS

Features, aspects, and embodiments are described in conjunction with the attached drawings, in which.

DETAILED DESCRIPTION

Hereinafter, a semiconductor memory apparatus and a data input/output method thereof, according to the present invention, will be described below with reference to the accompanying drawings through preferred embodiments.

Figure 2:
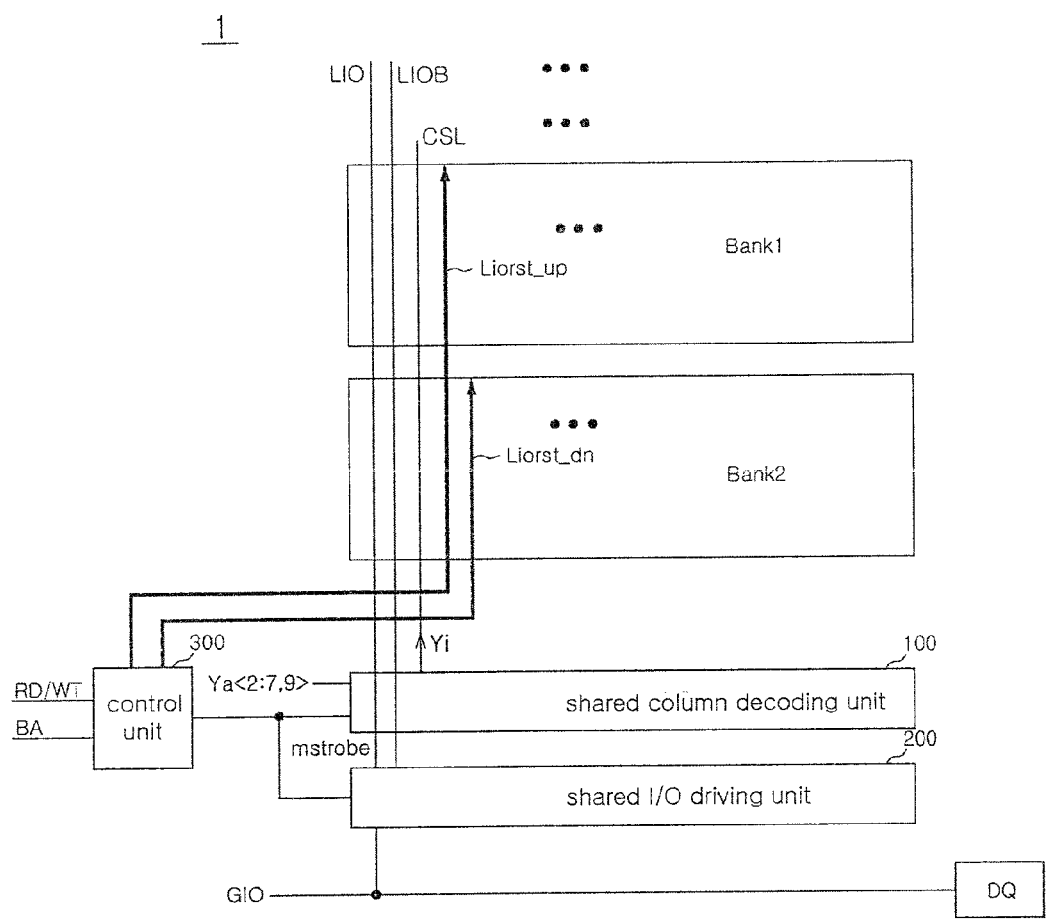
FIG. 2 is a block diagram schematically showing a configuration of a semiconductor memory apparatus including stacked memory banks according to an embodiment of the present invention.

FIG. 2 is a block diagram schematically showing a configuration of a semiconductor memory apparatus including a plurality of stacked memory banks, according to an embodiment of the present invention. As shown in FIG. 2, the semiconductor memory apparatus 1 according to the embodiment includes first and second memory banks Bank1 and Bank2, a shared column decoding unit 100, a shared input/output driving unit 200, and a control unit 300.

Hereinafter, it is assumed that the first and second memory banks Bank1 and Bank2 of semiconductor memory apparatus 1 constitute the stacked bank structure. Since, in general, both a same global input/output line and a same input/output pad are assigned to a plurality of memory banks constituting the stacked bank structure, both a same global input/output line GIO and a same input/output pad DQ are assigned to the first and second memory banks Bank1 and Bank2 in FIG. 2. Although only two memory banks Bank1 and Bank2 are shown in FIG. 2, the embodiment is not limited thereto, and the embodiment can also be applied to a case where three or more memory banks are stacked.

The first and second memory banks Bank1 and Bank2 share a column selection line CSL and local input/output lines LIO and LIOB. The column selection line CSL is included for selection of a column of the semiconductor memory apparatus 1. A column selection signal 'Yi' generated from the column decoding unit 100 is provided via the column selection line CSL. The local input/output lines LIO and LIOB are data input/output lines which selectively transfer data stored in the first memory bank Bank1 and data stored in the second memory bank Bank2 onto the global input/output line GIO, in a data read operation; and selectively transfer data transferred via the global input/output line GIO to the first memory bank Bank1 and to the second memory bank Bank2, in a data write operation. The semiconductor memory apparatus 1 includes a number of the column selection lines CSL and a number of the local input/output lines LIO and LIOB as much as the number of columns of the first and second memory banks Bank1 and Bank2.

Figure 1:
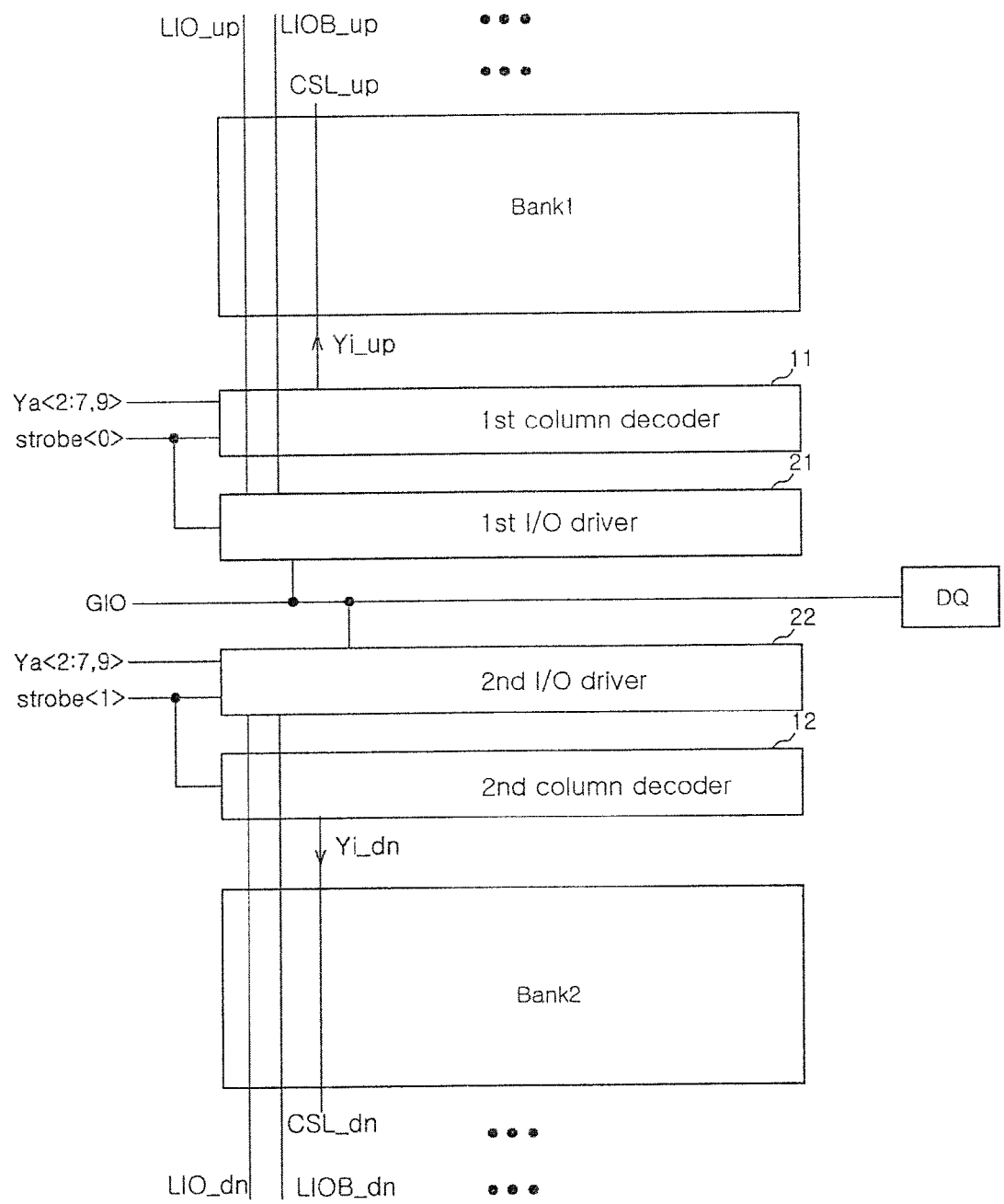
FIG. 1 is a block diagram schematically showing a configuration of a semiconductor memory apparatus including stacked memory banks.

Referring back to FIG. 1, the first and second memory banks Bank1 and Bank2 constituting the stacked bank structure in FIG. 1 do not share a column selection line, and instead include separate column selection lines CSL_up and CSL_dn. Therefore, in FIG. 1, the column decoders 11 and 12 are responsive to their corresponding strobe signals 'strobe<0:1>' to decode the column address signals 'Ya<2:7, 9>', and then provide the separate column selection signals 'Yi_up' and 'Yi_dn' to the memory banks Bank1 and Bank2, thus indicating whether the data read/write operation is to be performed on the first memory bank Bank1 or on the second memory bank Bank2.

However, in FIG. 2, according to the embodiment of the present invention, the shared column decoding unit 100 simultaneously provides the column selection signal 'Yi' via the column selection line CSL to the memory banks Bank1 and Bank2, in response to column address signals 'Ya<2:7, 9>' and a main strobe signal 'mstrobe'. More specifically, in FIG. 2, since the first and second memory banks Bank1 and Bank2 share the column selection line CSL, the shared column decoding unit 100 enables the column selection line CSL which the memory banks Bank1 and Bank2 share, in response to the column address signals 'Ya<2:7, 9>' and the main strobe signal 'mstrobe', when the semiconductor memory apparatus 1 performs the data read/write operation on the first memory bank Bank1 and when the semiconductor memory apparatus 1 performs the data read/write operation on the second memory bank Bank2. In other words, the shared column decoding unit 100 simultaneously provides the column selection signal 'Yi' to the first and second memory banks Bank1 and Bank2 in response to the column address signals 'Ya<2:7, 9>' when the main strobe signal 'mstrobe' is enabled. The main strobe signal 'mstrobe' is generated by combining strobe signals (e.g., the strobe signals shown in FIG. 1), and will be described later.

The shared input/output driving unit 200 performs the data read/write operation in response to the main strobe signal 'mstrobe'. More specifically, for a data read operation on the first memory bank Bank1 and for a data read operation on the second memory bank Bank2, in response to the main strobe signal 'mstrobe', the shared input/output driving unit 200 receives and amplifies data on the shared local input/output lines LIO and LIOB and transfers the amplified data onto the global input/output line GIO. On the other hand, for the data write operation on the first memory bank Bank1 and for the data write operation on the second memory bank Bank2, in response to the main strobe signal 'mstrobe', the shared input/output driving unit 200 amplifies the data on the global input/output line GIO and transfers the amplified data onto the shared local input/output lines LIO and LIOB. That is, in response to the main strobe signal 'mstrobe', the shared input/output driving unit 200 is enabled and performs the amplification operation, both when the semiconductor memory apparatus 1 performs the data read/write operation on the first memory bank Bank1 and when the semiconductor memory apparatus 1 performs the data read/write operation on the second memory bank Bank2. In an embodiment, the shared input/output driving unit 200 comprises a plurality of input/output drivers, as will be described in further detail later. Since the first and second memory banks Bank1 and Bank2 share the local input/output lines LIO and LIOB, the number of the input/output drivers can be reduced to half the number of the input/output drivers of the conventional art.

The shared local input/output lines LIO and LIOB are selectively and electrically connected to the first memory bank Bank1 and the second memory bank Bank2 in response to the bank selection signals 'Liorst_up' and 'Liorst_dn'. More specifically, when the bank selection signals 'Liorst_up' and 'Liorst_dn' are such that the first memory bank Bank1 is selected, the shared local input/output lines LIO and LIOB communicate with only the first memory bank Bank1. On the other hand, when the bank selection signals 'Liorst_up' and 'Liorst_dn' are such that the second memory bank Bank2 is selected, the shared local input/output lines LIO and LIOB communicate with only the second memory bank Bank2. Therefore, the interval during which the shared local input/output lines LIO and LIOB are electrically connected to the first memory bank Bank1 does not overlap with the interval during which the shared local input/output lines LIO and LIOB are electrically connected to the second memory bank Bank2.

As such, even though the first and second memory banks Bank1 and Bank2 share the column decoding unit and the input/output driving unit, the semiconductor memory apparatus 1 according to the embodiment can properly perform data read/write operations without a data collision. This is because the shared local input/output lines LIO and LIOB selectively communicate with the first and second memory banks Bank1 and Bank2 in response to the bank selection signals 'Liorst_up' and 'Liorst_dn'.

As shown in FIG. 2, the semiconductor memory apparatus 1 according to an embodiment can further include the control unit 300 configured to generate the main strobe signal 'mstrobe' and the bank selection signals 'Liorst_up' and 'Liorst_dn' in response to the read/write command 'RD/WT' and a bank address signal 'BA'. The read/write command 'RD/WT' is a signal that instructs the semiconductor memory apparatus 1 to perform the data read/write operation and can be inputted from the outside of the semiconductor memory apparatus 1 via pads. The bank address signal 'BA' is a signal that includes information for selecting a memory bank on which the data read/write operation is to be actually performed and can be inputted from the outside via pads. Therefore, the control unit 300 performs the function of combining and differentiating between information on the data read/write operations of the respective first and second memory banks Bank1 and Bank2. In particular, both when the semiconductor memory apparatus 1 performs the data read/write operation on the first memory bank Bank1 and when the semiconductor memory apparatus 1 performs the data read/write operation on the second memory bank Bank2, the control unit 300 generates a main strobe signal 'mstrobe' instructing the shared column decoding unit to provide the column selection signal 'Yi', and the column selection signal 'Yi' is provided to both of the memory banks Bank1 and Bank2. The main strobe signal 'mstrobe' generated by the control unit 300 also enables the shared input/output driving unit 200 to perform the amplification operation. As explained above, even though the column selection signal 'Yi' is provided to both the first and second memory banks Bank1 and Bank2 simultaneously, the bank selection signals 'Liorst_up' and 'Liorst_dn' generated from the control unit 300 can specify the intended memory bank that the data read/write operation is to be actually performed on.

Figure 3:
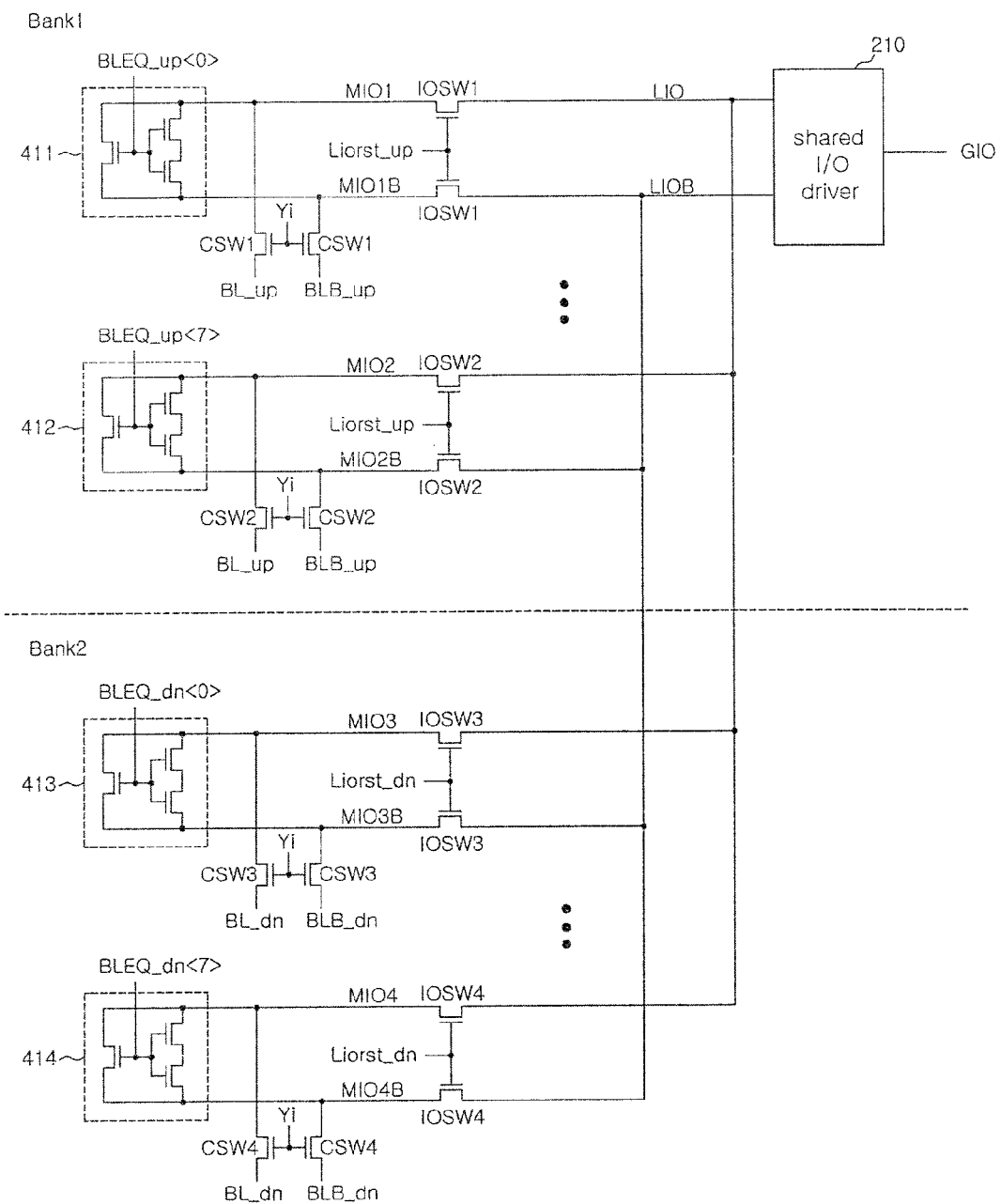
FIG. 3 is a circuit diagram showing a configuration of an embodiment of the semiconductor memory apparatus of FIG. 2.

FIG. 3 is a circuit diagram showing a configuration of the semiconductor memory apparatus 1 of FIG. 2, according to an embodiment of the present invention. As shown in FIG. 3, the semiconductor memory apparatus 1 includes first bit lines BL_up and BLB_up, second bit lines BL_dn and BLB_dn, first to fourth middle input/output lines MIO1 to MIO4 and MIO1B to MIO4B, shared local input/output lines LIO and LIOB, a shared input/output driver 210, and first to fourth precharge units 411 to 414. In FIG. 3, in order to avoid obscuring the drawing, the shared column decoding unit 100 of FIG. 2 is not shown, but the column selection signal 'Yi' generated from the shared column decoding unit 100 is shown instead.

In FIG. 3, the first bit lines BL_up and BLB_up are electrically connected to the first memory bank Bank1 to receive/transfer data from/to the first memory bank Bank1. In an embodiment, the first bit lines BL_up and BLB_up intersect with a plurality of word lines forming a plurality of memory cells. Although actual wiring connections between the first bit lines BL_up and BLB_up and the word lines are not shown in FIG. 3 to avoid obscuring the invention, the first bit lines BL_up and BLB_up may intersect with a total of 8 word lines. However, it should be understood that the embodiment is not limited thereto. Likewise, the second bit lines BL_dn and BLB_dn are electrically connected to the second memory bank Bank2 to receive/transfer data from/to the second memory bank Bank2. In an embodiment, the second bit lines BL_dn and BLB_dn are also coupled to 8 word lines.

As shown in FIG. 3, first to fourth column switches CSW1 to CSW4 are interposed between the first and second bit lines BL_up, BLB_up, BL_dn and BLB_dn and the first to fourth middle input/output lines MIO1 to MIO4 and MIO1B to MIO4B. When the column selection signal 'Yi' is enabled, the first to fourth column switches CSW1 to CSW4 are all turned on, and thus an electrical connection is established between the first and second bit lines BL_up, BLB_up, BL_dn and BLB_dn and the first to fourth middle input/output lines MIO1 to MIO4 and MIO1B to MIO4B. In addition, first to fourth input/output switching units IOSW1 to IOSW4 are interposed between the first to fourth middle input/output lines MIO1 to MIO4, MIO1B to MIO4B and the shared local input/output lines LIO and LIOB. In an embodiment, the respective first to fourth input/output switching units IOSW1 to IOSW4 comprise NMOS transistors similar to the first to fourth column switches CSW1 to CSW4. Herein, the bank selection signals 'Liorst_up' and 'Liorst_dn' control whether the respective first to fourth input/output switching units IOSW1 to IOSW4 are turned on or off. In detail, if the bank selection signals 'Liorst_up' and 'Liorst_dn' are generated by the control unit to select the first memory bank Bank1 (i.e., for example, when the up bank selection signal 'Liorst_up' is enabled) the first and second input/output switching units IOSW1 and IOSW2 are both turned on establishing an electrical connection between the first and second middle input/output lines MIO1, MIO1B, MIO2, MIO2B and the shared local input/output lines LIO and LIOB. Conversely, when the bank selection signals 'Liorst_up' and 'Liorst_dn' are generated by the control unit to select the second memory bank Bank2 (i.e., for example, if the down bank selection signal 'Liorst_dn' is enabled) the third and fourth input/output switching units IOSW3 and IOSW4 are both turned on establishing an electrical connection between the third and fourth middle input/output lines MIO3, MIO3B, MIO4, MIO4B and the shared local input/output lines LIO and LIOB.

The shared local input/output lines LIO and LIOB are coupled to the shared input/output driver 210, and an output of the shared input/output driver 210 is coupled to the global input/output line GIO.

Accordingly, both when the semiconductor memory apparatus 1 performs a data read/write operation on the first memory bank Bank1 and when the semiconductor memory apparatus 1 performs a data read/write operation on the second memory bank Bank2, the first and second bit lines BL_up, BLB_up, BL_dn and BLB_dn are electrically connected to the first to fourth middle input/output lines MIO1 to MIO4 and MIO1B to MIO4B, respectively, because the column selection signal 'Yi' is enabled irrespective of which memory bank Bank1 or Bank2 the read/write operation is associated with.

When the semiconductor memory apparatus 1 performs the data read/write operation on the first memory bank Bank1, the up bank selection signal 'Liorst_up' is enabled, and subsequently the first and second input/output switching units IOSW1 and IOSW2 are both turned on, and on the other hand, the third and fourth input/output switching units IOSW3 and IOSW4 are both turned off. Therefore, the first and second middle input/output lines MIO1, MIO1B, MIO2 and MIO2B are electrically connected to the shared local input/output lines LIO and LIOB, and on the other hand, the third and fourth middle input/output lines MIO3, MIO3B, MIO4 and MIO4B are electrically disconnected from the shared local input/output lines LIO and LIOB. Therefore, even though each of the first to fourth column switches CSW1 to CSW4 of the memory banks Bank1 and Bank2 are turned on in response to the column selection signal 'Yi' generated by the column decoding unit 100, whereby the first and second bit lines BL_up, BLB_up, BL_dn and BLB_dn are electrically connected to the first to fourth middle input/output lines MIO1 to MIO4 and MIO1B to MIO4B, the shared local input/output lines LIO and LIOB are electrically connected to only the first and second middle input/output lines MIO1, MIO1B, MIO2 and MIO2B via the first and second input/output switching units IOSW1 and IOSW 2 among the first to fourth middle input/output lines MIO1 to MIO4 and MIO1B to MIO4B. Accordingly, the semiconductor memory apparatus 1 can perform the data read/write operation on the first memory bank Bank1 successfully.

Conversely, when the semiconductor memory apparatus 1 performs the data read/write operation on the second memory bank Bank2, the down bank selection signal 'Liorst_dn' is enabled, and subsequently the first and second input/output switching units IOSW1 and IOSW2 are both turned off, and on the other hand, the third and fourth input/output switching units IOSW3 and IOSW4 are both turned on. Therefore, the first and second middle input/output lines MIO1, MIO1B, MIO2 and MIO2B are electrically disconnected from the shared local input/output lines LIO and LIOB, and on the other hand, the third and fourth middle input/output lines MIO3, MIO3B, MIO4 and MIO4B are electrically connected to the shared local input/output lines LIO and LIOB. Therefore, even though each of the first to fourth column switches CSW1 to CSW4 of the memory banks Bank1 and Bank2 are turned on in response to the column selection signal 'Yi' generated by the column decoding unit 100, whereby the first and second bit lines BL_up, BLB_up, BL_dn and BLB_dn are electrically connected to the first to fourth middle input/output lines MIO1 to MIO4 and MIO1B to MIO4B, the shared local input/output lines LIO and LIOB are electrically connected to only the third and fourth middle input/output lines MIO3, MIO3B, MIO4 and MIO4B among the first to fourth middle input/output lines MIO1 to MIO4 and MIO1B to MIO4B via the third and fourth input/output switching units IOSW3 and IOSW4. Accordingly, the semiconductor memory apparatus 1 can perform the data read/write operation on the second memory bank Bank2 successfully.

Herein, it is preferable that the respective pulse widths of the bank selection signals 'Liorst_up' and 'Liorst_dn' are wider than the pulse width of the column selection signal 'Yi'. More specifically, it is preferable that the respective bank selection signals 'Liorst_up' and 'Liorst_dn' are enabled earlier than the column selection signal 'Yi' and are disabled later than the column selection signal 'Yi'. When a data read/write operation performed on the first memory bank Bank1 of the semiconductor memory apparatus 1, early enablement of the up bank selection signal 'Liorst_up' with respect to the column selection signal 'Yi' allows the semiconductor memory apparatus 1 to turn on the first and second input/output switching units IOSW1 and IOSW2 earlier than the corresponding column switches CSW1 and CSW2 and be ready to perform the data read/write operation. Further, late disablement of the up bank selection signal 'Liorst_up' with respect to the column selection signal 'Yi' allows the semiconductor memory apparatus 1 to substantially maintain the turn-on state of the first and second input/output switching units IOSW1 and IOSW2 until the data read/write operation is finished, thereby allowing the data read/write operation to be completed safely. Likewise, when a data read/write operation is performed on the second memory bank Bank2 of the semiconductor memory apparatus 1, early enablement of the down bank selection signal 'Liorst_dn' with respect to the column selection signal 'Yi' allows the semiconductor memory apparatus 1 to turn on the third and fourth input/output switching units IOSW3 and IOSW4 earlier than the corresponding column switches CSW3 and CSW4 and be ready to perform the data read/write operation. Further, late disablement of the down bank selection signal 'Liorst_dn' with respect to the column selection signal 'Yi' allows the semiconductor memory apparatus 1 to substantially maintain the turn-on state of the third and fourth input/output switching units IOSW3 and IOSW4 until the data read/write operation is finished, thereby allowing the data read/write operation to be completed safely.

Referring to FIG. 3, the first to fourth precharge units 411 to 414 precharge the first to fourth middle input/output lines MIO1 to MIO4 and MIO1B to MIO4B, respectively. That is, when the word line is disabled, the first to fourth precharge units 411 to 414 precharge the first to fourth middle input/output lines MIO1 to M1O4 and MIO1B to MIO4B in response to precharge signals 'BLEQ_up<0:7>' and 'BLEQ_dn<0:7>', respectively. Since the first to fourth precharge units 411 to 414 can be readily implemented, a detailed description thereof will be omitted.

FIG. 3 shows an exemplary wiring connection of input/output lines of a single column among a plurality of columns of the first and second memory banks Bank1 and Bank2. Therefore, with respect to the first and second memory banks Bank1 and Bank2, the configuration shown in FIG. 3 is repeated in plurality as much as the number of the columns of the memory banks Bank1 and Bank2 in an embodiment of the present invention. Further, the shared input/output driver 210 is included in plurality as much as the number of the columns of the memory banks Bank1 and Bank2 in an embodiment of the present invention. Accordingly the plurality of the shared input/output drivers 210 would constitute the shared input/output driving unit 200 shown in FIG. 2.

Figure 4:
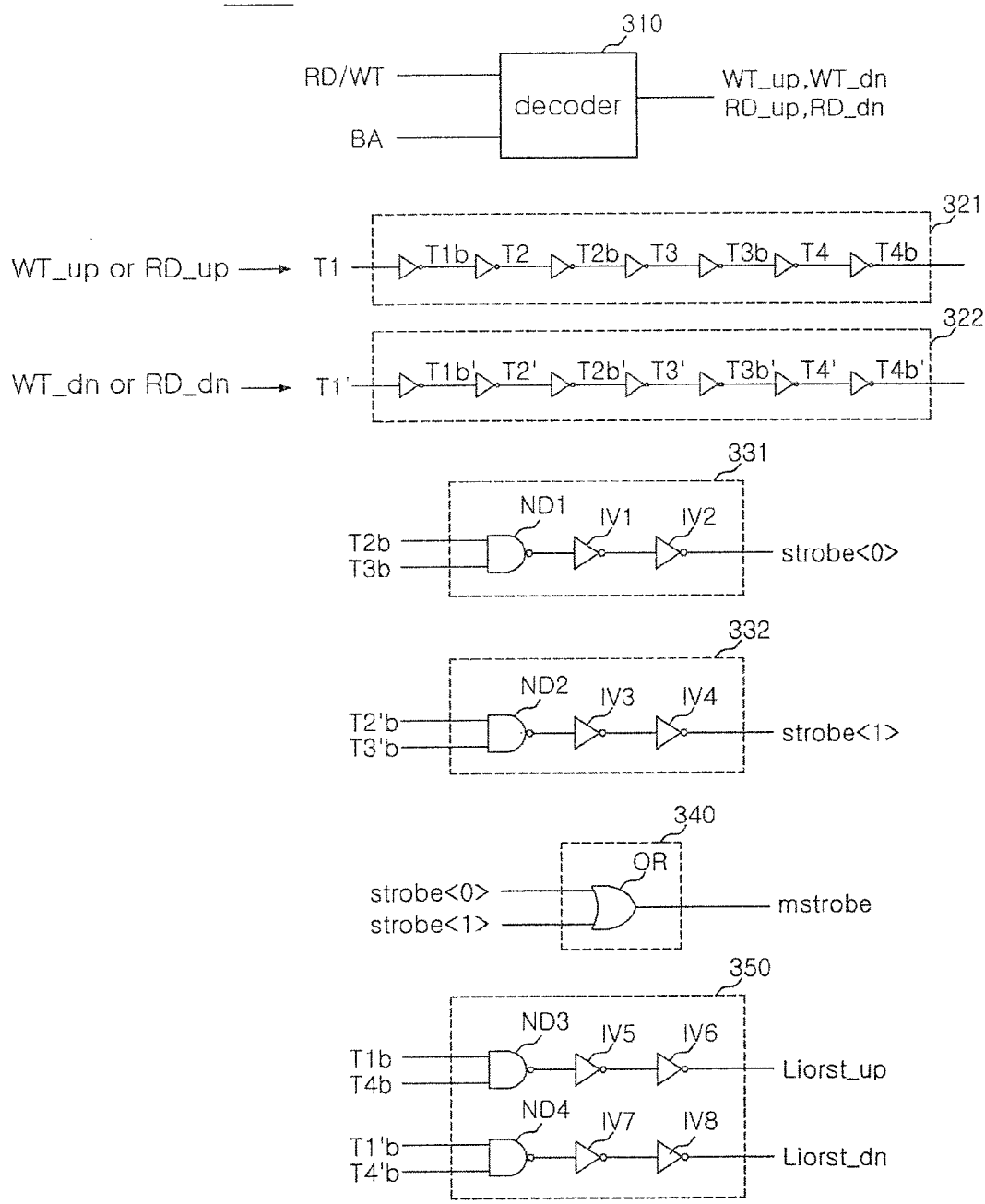
FIG. 4 is a diagram showing a configuration of an embodiment of the control unit of FIG. 2.

FIG. 4 is a diagram showing a configuration of an embodiment of the control unit 300 shown in FIG. 2. As shown in FIG. 4, the control unit 300 includes a decoder 310, first and second delay units 321 and 322, first and second strobe signal generating units 331 and 332, a strobe combination unit 340, and a bank selection signal generating unit 350.

Referring to FIG. 4, the decoder 310 decodes the read/write command 'RD/WT' and the bank address signal 'BA' to generate first and second internal strobe signals 'WT_up', 'RD_up' and 'WT_dn', 'RD_dn'. Since the read/write command 'RD/WT' is a signal that instructs the semiconductor memory apparatus 1 to perform a data read/write operation and the bank address signal 'BA' includes information on which memory bank the data read/write operation is to be actually performed, the first internal strobe signals 'WT_up' and 'RD_up' include information on the data read/write operation of the first memory bank Bank1, and the second internal strobe signals 'WT_dn' and 'RD_dn' include information on the data read/write operation of the second memory bank Bank2. Since the decoder 310 can be implemented by those skilled in the art, a detailed description thereon will be omitted. Hereinafter, for convenience of description, the first internal strobe signals 'WT_up' and 'RD_up' associated with a data read/write operation on the first memory bank Bank1 will be represented as a signal 'T1', and the second internal strobe signals 'WT_dn' and 'RD_dn' associated with a data read/write operation on the second memory bank Bank2 will be represented as a signal 'Ti''.

As shown in FIG. 4, the first delay unit 321 according to an embodiment includes seven inverters coupled in series and delays the first internal strobe signal 'T1' sequentially. Similarly, the second delay unit 322 according to an embodiment includes seven inverters coupled in series and delays the second internal strobe signal 'T1'' sequentially. It should be understood that the present invention is not limited to seven inverters for the first and second delay units 321, and the number of inverters may be adjusted according to the desired pulse width of the up and down band selection signals 'Liorst_up' and 'Liorst_down' as will be apparent from the description below.

The first strobe signal generating unit 331 receives delay signals 'T2b' and 'T3b' and generates the first strobe signal 'strobe<0>'. In an embodiment, the first strobe signal generating unit 331 includes a first NAND gate ND1 receiving the delay signals 'T2b' and 'T3b', and first and second inverters IV1 and IV2 sequentially inverting the output of the first NAND gate ND1. Similarly, the second strobe signal generating unit 332 receives delay signals 'T2'b' and 'T3'b' and generates the second strobe signal 'strobe<1>'. In an embodiment, the second strobe signal generating unit 332 includes a second NAND gate ND2 receiving the delay signals 'T2'b' and 'T3'b', and third and fourth inverters IV3 and IV4 sequentially inverting an output of the second NAND gate ND2.

The strobe combination unit 340 combines the first and second strobe signals 'strobe<0:1>' to generate the main strobe signal 'mstrobe'. The strobe combination unit 340 can, in an embodiment, be implemented with an OR gate receiving the first and second strobe signals 'strobe<0:1>' to generate the main strobe signal 'mstrobe'.

In an embodiment, the bank selection signal generating unit 350 includes third and fourth NAND gates ND3 and ND4 and fifth to eighth inverters IV5, IV6, IV7 and IV8. The third NAND gate ND3 receives delay signals 'T1b' and 'T4b'; and therefore, the up bank selection signal 'Liorst_up' generated by the bank selection signal generating unit 350 has a pulse width wider than that of the first strobe signal 'strobe<0>'. Likewise, since the fourth NAND gate ND4 receives delay signals 'T1'b' and 'T4'b', the down bank selection signal 'Liorst_dn' generated from the bank selection signal generating unit 350 has a pulse width wider than that of the second strobe signal 'strobe<1>'.

It will be apparent to those skilled in the art that the control unit 300 can be implemented in a variety of logic configurations. In addition, it will be understood that the strobe combination unit 340 and the bank selection signal generating unit 350 included in the control unit 300 may alternatively be included in the shared column decoding unit 100 or the shared input/output driving unit 200 or other alternative implementations.

Figure 5:
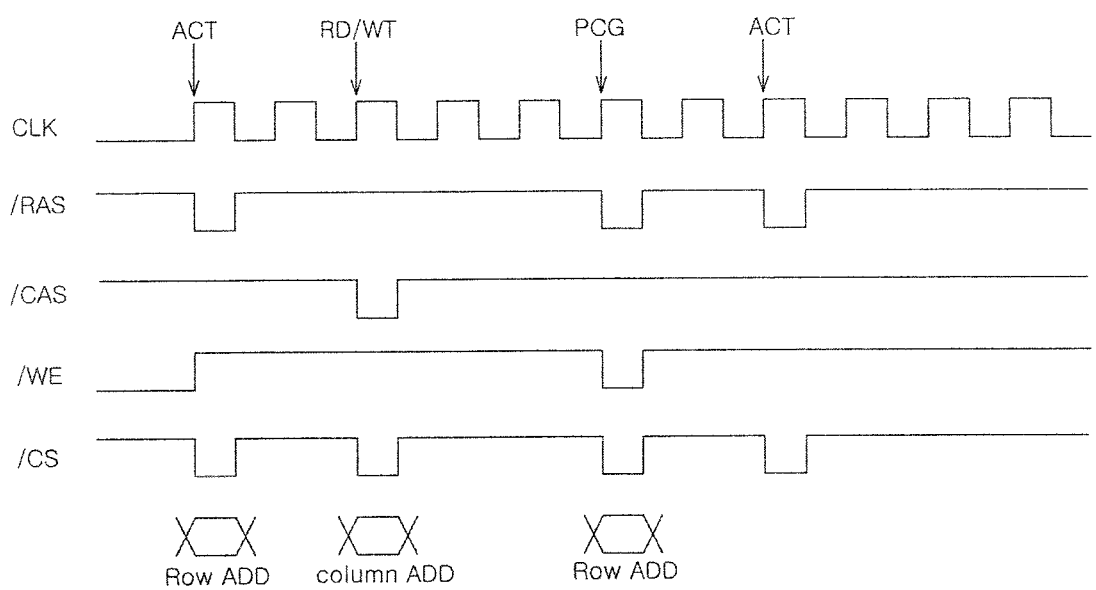
FIG. 5 is a timing diagram showing an operation of a semiconductor memory apparatus shown in FIG. 1 in response to various commands.

FIG. 5 is a timing diagram showing an operation of a conventional semiconductor memory apparatus in response to various commands. As shown in FIG. 5, the conventional semiconductor memory apparatus receives the various commands and performs various operations in response to the commands. In response to the commands inputted to the conventional semiconductor memory apparatus, the conventional semiconductor memory apparatus receives a row address strobe signal '/RAS', a column address strobe signal '/CAS', a write enable signal '/WE', and a chip selection signal '/CS'. In general, a command buffer receives the signals '/RAS', '/CAS', '/WE' and '/CS' corresponding to the commands and a clock enable signal 'CKE' (not shown) to generate internal command signals. With reference to FIG. 5, if an active command 'ACT' is applied to the conventional semiconductor memory apparatus, the conventional semiconductor memory apparatus receives the enabled row address strobe signal '/RAS' and the enabled write enable signal '/WE' and thereby receives a row address signal 'Row ADD'. Therefore, a word line selected in response to the row address signal 'Row ADD' is enabled, and the conventional semiconductor memory apparatus enters an active mode. Afterwards, when the read/write command 'RD/WT' is applied, the column address strobe signal '/CAS' is enabled, and the conventional semiconductor memory apparatus receives a column address signal 'Column ADD'. Therefore, a column selection line selected in response to the column address signal 'Column ADD' is enabled, and consequently the conventional semiconductor memory apparatus can perform the data read/write operation. At this time, the strobe signals 'strobe<0:1>' are generated in response to the read/write command 'RD/WT'. Afterwards, when a precharge command 'PCG' is applied, the enabled word line is disabled and the conventional semiconductor memory apparatus enters a stand-by mode. The above-mentioned operation is performed repetitively, and thus the data input/output operation can be performed.

With reference to FIGS. 3 to 5, the reason that the semiconductor memory apparatus 1 according to an embodiment generates the bank selection signals 'Liorst_up' and 'Liorst_dn' by using the read/write command 'RD/WT' will now be explained.

In the conventional art, the plurality of stacked memory banks cannot share the local input/output lines, because the conventional semiconductor memory apparatus controls switching units using a signal generated from the active command 'ACT', which allows the row address signal 'Row ADD' to be inputted to the conventional semiconductor memory apparatus. Herein, if the semiconductor memory apparatus 1 shown in FIGS. 2-4 were to control the first to fourth input/output switching units IOSW1 to IOSW4 using a signal generated from the active command 'ACT' as is done in the conventional art, the first to fourth input/output switching units IOSW1 to IOSW4 would be turned-on during the entire time interval of the active mode of the semiconductor memory apparatus 1. Because the semiconductor memory apparatus 1 simultaneously enables the column selection line CSL of the memory banks Bank1 and Bank2 during a data read operation by using the shared column decoding unit 100, the data stored in the different memory banks, i.e., Bank1 and Bank2, would be simultaneously transferred onto the shared local input/output lines LIO and LIOB via the first to fourth input/output switching units IOSW1 to IOSW4. This causes a collision between the data transferred from the first memory bank Bank1 onto the shared local input/output line and the data transferred from the second memory bank Bank2 onto the shared local input/output line. As such, according to the practices of the conventional art, the plurality of the stacked memory banks cannot share the column decoder, the column selection line, the local input/output line and the input/output driver.

However, since the semiconductor memory apparatus 1 according to embodiments of the present invention controls the first to fourth input/output switching units IOSW1 to IOSW4 in response to the bank selection signals 'Liorst_up' and 'Liorst_dn', which are generated from the read/write command 'RD/WT', the above-mentioned data collision does not occur. That is, even though the plurality of the stacked memory banks Bank1 and Bank2 share the local input/output lines LIO and LIOB, data collision does not occur because the semiconductor memory apparatus 1 selectively turns on the respective first to fourth input/output switching units IOSW1 to IOSW4 so that the corresponding middle input/output lines are connected during the interval in which the data read/write operation is actually performed rather than during the entire interval of the active mode. Accordingly, in FIG. 3, even though specific word lines of the memory banks Bank1 and Bank2 are simultaneously enabled and the column selection signals 'Yi' of the memory banks Bank1 and Bank2 are simultaneously enabled during data read/write operations for both the first memory bank Bank1 and the second memory bank Bank2, collision between the data transferred from the different memory banks Bank1 and Bank2 can be avoided. The first and second input/output switching units IOSW1 and IOSW2 are both turned on only during the interval during which the data read/write operation is actually performed on the first memory bank Bank1, in response to the up bank selection signal 'Liorst_up'; and conversely, the third and fourth input/output switching units IOSW3 and IOSW4 are both turned on only during the interval during which the data read/write operation is actually performed on the second memory bank Bank2, in response to the down bank selection signal 'Liorst_dn'.

A data read/write operation of the semiconductor memory apparatus 1 according to an embodiment of the present invention will now be described with reference to FIGS. 2 to 4 and 6.

Referring to FIG. 4, the decoder 310 decodes the read/write command 'RD/WT' and the bank address signal 'BA' to generate the first and second internal strobe signals 'WT_up', 'RD_up' and 'WT_dn', 'RD_dn'. The first strobe signal generating unit 331 generates the first strobe signal 'strobe<0>' in response to the first internal strobe signals 'WT_up' and 'RD_up', and the second strobe signal generating unit 332 generates the second strobe signal 'strobe<1>' in response to the second internal strobe signals 'WT_dn' and 'RD_dn'. The strobe combination unit 340 combines the first and second strobe signals 'strobe<0:1>' to generate the main strobe signal 'mstrobe'. In addition, the bank selection signal generating unit 350 generates the up bank selection signal 'Liorst_up' having the pulse width wider than the pulse width of the first strobe signal 'strobe<0>', and generates the down bank selection signal 'Liorst_dn' having the pulse width wider than the pulse width of the second strobe signal 'strobe<1>'.

Figure 6:
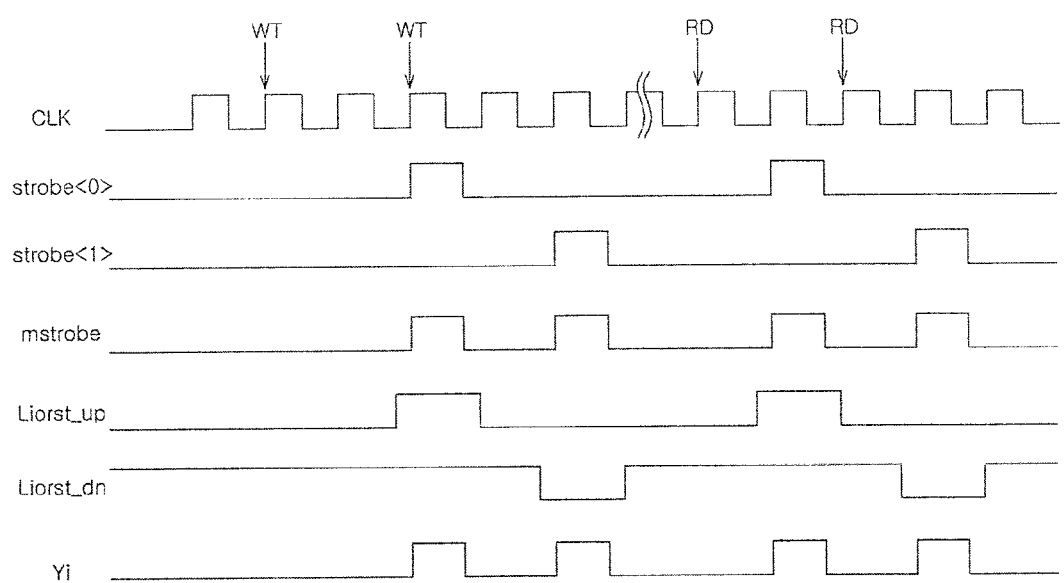
FIG. 6 is a timing diagram showing a data read/write operation of the semiconductor memory apparatus of FIG. 2, according to an embodiment.

FIG. 6 is a timing diagram showing the data read/write operation of the semiconductor memory apparatus 1 of FIG. 2, according to an embodiment of the present invention. In FIG. 6, the first write command 'WT' and the first read command 'RD' (from left) are both associated with the first memory bank Bank1 and the second write command 'WT' and the second read command 'RD' (from left) are both associated with the second memory bank Bank2.

Firstly, if the first write command 'WT' is applied to the semiconductor memory apparatus 1, the shared column decoding unit 100 enables the column selection signals 'Yi' of both the memory banks Bank1 and Bank2 in response to the first pulse signal of the main strobe signal 'mstrobe'. Therefore, in FIG. 3, since the first to fourth column switches CSW1 to CSW4 are all turned on, the first and second bit lines BL_up, BLB_up, BL_dn and BLB_dn are electrically connected to the first to fourth middle input/output lines MIO1 to MIO4 and MIO1B to MIO4B. At this time, only the first and second input/output switching units IOSW1 and IOSW2 among the input/output switching units IOSW1 to IOSW4 are turned on in response to the enabled up bank selection signal 'Liorst_up'; and therefore, only the first and second middle input/output lines MIO1, MIO1B, MIO2 and MIO2B among the middle input/output lines MIO1 to MIO4 and MIO1B to MIO4B are electrically connected to the shared local input/output lines LIO and LIOB. Therefore, even though the first to fourth column switches CSW1 to CSW4 of the memory banks Bank1 and Bank2 are all turned on in response to the column selection signal 'Yi', only the first memory bank Bank1 is electrically connected to the shared local input/output lines LIO and LIOB. Since the shared input/output driving unit 200 is enabled in response to the main strobe signal 'mstrobe', the shared input/output driving unit 200 amplifies data transferred via the pad DQ and the global input/output line GIO, and transfers the amplified data onto the shared local input/output lines LIO and LIOB. Then, since the shared local input/output lines LIO and LIOB are electrically connected to the first bit lines BL_up and BLB_up, the transferred data on the shared local input/output lines LID and LIOB can be transferred onto the first bit lines BL_up and BLB_up, and consequently can be stored in a memory cell of the first memory bank Bank1 coupled to the first bit lines BL_up and BLB_up.

Secondly, on the other hand, if the second write command 'WT' is applied to the semiconductor memory apparatus 1, the shared column decoding unit 100 enables the column selection signals 'Yi' of both the memory banks Bank1 and Bank2 in response to the second pulse signal of the main strobe signal 'mstrobe'. Therefore, in FIG. 3, since the first to fourth column switches CSW1 to CSW4 are all turned on, the first and second bit lines BL_up, BLB_up, BL_dn and BLB_dn are electrically connected to the first to fourth middle input/output lines MIO1 to MIO4 and MIO1B to MIO4B. At this time, only the third and fourth input/output switching units IOSW3 and IOSW4 among the input/output switching units IOSW1 to IOSW4 are turned on in response to the enabled down bank selection signal 'Liorst_dn'; and therefore, only the third and fourth middle input/output lines MIO3, MIO3B, MIO4 and MIO4B among the middle input/output lines MIO1 to MIO4 and MIO1B to MIO4B are electrically connected to the shared local input/output lines LIO and LIOB. Therefore, even though the first to fourth column switches CSW1 to CSW4 of the memory banks Bank1 and Bank2 are all turned on in response to the column selection signal 'Yi', only the second memory bank Bank2 is electrically connected to the shared local input/output lines LIO and LIOB. Since the shared input/output driving unit 200 is enabled in response to the main strobe signal 'mstrobe', the shared input/output driving unit 200 amplifies data transferred via the pad DQ and the global input/output line GIO, and transfers the amplified data onto the shared local input/output lines LIO and LIOB. Then, since the shared local input/output lines LIO and LIOB are electrically connected to the second bit lines BL_dn and BLB_dn, the transferred data on the shared local input/output lines LIO and LIOB can be transferred onto the second bit lines BL_dn and BLB_dn, and consequently can be stored in a memory cell of the second memory bank Bank2 coupled to the second bit lines BL_dn and BLB_dn.

Thirdly, if the first read command 'RD' is applied to the semiconductor memory apparatus 1, the first bit lines BL_up and BLB_up are electrically connected to the shared local input/output lines LIO and LIOB as described above. Therefore, the shared input/output driving unit 200 amplifies data transferred from the memory cell of the first memory bank Bank1 via the first bit lines BL_up and BLB_up and the shared local input/output lines LIO and LIOB, and outputs the amplified data to outside of the semiconductor memory apparatus 1 via the global input/output line GIO and a pad DQ.

Finally, on the other hand, if the second read command 'RD' is applied to the semiconductor memory apparatus 1, the second bit lines BL_dn and BLB_dn are electrically connected to the shared local input/output lines LIO and LIOB as described above. Therefore, the shared input/output driving unit 200 amplifies data transferred from the memory cell of the second memory bank Bank2 via the second bit lines BL_dn and BLB_dn and the shared local input/output lines LIO and LIOB, and outputs the amplified data to outside of the semiconductor memory apparatus 1 via the global input/output line GIO and a pad DQ.

As such, in the semiconductor memory apparatus and the data input/output method thereof according to an embodiment of the present invention, a plurality of stacked memory banks can share a column decoder and an input/output driver without data collision, thereby improving the lay-out margin of the semiconductor memory apparatus.

While certain embodiments have been described above, it will be understood to those skilled in the art that the embodiments described are by way of example only. Accordingly, the device and method described herein should not be limited based on the described embodiments. Rather, the apparatus described herein should only be limited in light of the claims that follow when taken in conjunction with the above description and accompanying drawings.

What is claimed is:

1. A semiconductor memory apparatus comprising:
a shared column decoding unit configured to simultaneously enable a column selection line of first and second memory banks in response to a column address signal and a main strobe signal;
an input/output switching unit configured to selectively electrically connect the first and second memory banks to a shared local input/output line in response to a bank selection signal;
a shared input/output driving unit configured to amplify data transferred via the shared local input/output line and transfer the amplified data onto a global input/output line in a data read operation, and to amplify data transferred via the global input/output line and transfer the amplified data onto the shared local input/output line in a data write operation, in response to the main strobe signal; and
a control unit configured to generate the bank selection signal and the main strobe signal in response to a read/write command and a bank address signal.

2. The semiconductor memory apparatus of claim 1, wherein the bank selection signal includes information indicating which one of the first and second memory banks is associated with the data read/write operation.

3. The semiconductor memory apparatus of claim 1, wherein the main strobe signal includes information on the data read or data write operation of the first and second memory banks.

4. The semiconductor memory apparatus of claim 1, wherein the bank selection signal is configured to be enabled earlier than a column selection signal, and to be disabled later than the column selection signal.

5. A semiconductor memory apparatus comprising:
a first memory bank;
a second memory bank;
first and second middle input/output lines configured to communicate with the first and second memory banks respectively, in response to a column selection signal;
a shared local input/output line selectively electrically connected to the first and second middle input/output lines;
a shared input/output driving unit configured to amplify data transferred via the shared local input/output line and transfer the amplified data onto a global input/output line in a data read operation, and to amplify data transferred via the global input/output line and transfer the amplified data onto the shared local input/output line in a data write operation, in response to a main strobe signal; and
a control unit configured to generate the bank selection signal and the main strobe signal in response to a read/write command and a bank address signal,
wherein the column selection signal simultaneously enables communication of the first and second middle input/output lines with the first and second memory banks, and the electrical connection between the shared local input/output line and the first memory bank and the electrical connection between the shared local input/output line and the second memory bank are made selectively in response to a bank selection signal.

6. The semiconductor memory apparatus of claim 5, further comprising a column selection switching unit configured to transfer data stored in the first memory bank onto the first middle input/output line in a data read operation and transfer data transferred via the first middle input/output line to the first memory bank in a data write operation, when the column selection signal is enabled.

7. The semiconductor memory apparatus of claim 5, further comprising a column selection switching unit configured to transfer data stored in the second memory bank onto the second middle input/output line in a data read operation and transfer data transferred via the second middle input/output line to the second memory bank in a data write operation, when the column selection signal is enabled.

8. The semiconductor memory apparatus of claim 5, wherein the bank selection signal includes information indicating which one of the first and second memory banks is associated with a data read/write operation.

* * * * *